(12) United States Patent
Chang et al.

(10) Patent No.: US 6,407,454 B1
(45) Date of Patent: Jun. 18, 2002

(54) INTER-METAL DIELECTRIC LAYER

(75) Inventors: Ping-Yi Chang, KaoHsiung Hsien;
Pei-Ren Jeng; Chi-Tung Huang, both of Hsinchu, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/712,727

(22) Filed: Nov. 14, 2000

(51) Int. Cl.⁷ .............................................. H01L 23/28
(52) U.S. Cl. ...................................... 257/760; 257/774
(58) Field of Search ................................. 257/776, 774, 257/758, 760

(56) References Cited

U.S. PATENT DOCUMENTS 5,872,401 A * 2/1999 Huff et al. .................. 257/758

* cited by examiner

Primary Examiner—Roy Potter

(57) ABSTRACT

A method for manufacturing dielectric layers between metal parts by forming fluorine silicate glass by high density plasma deposition using radio frequency power of low bias voltage. The method includes filling in a gap with fluorine silicate glass by high density plasma deposition with slower rate of deposition and radio frequency power of high bias voltage, and then using fluorine silicate glass deposited with fast rate of deposition and radio frequency power of no or low bias voltage as a sacrificial layer, and being made plane by a chemical-mechanic polishing CMP.

7 Claims, 6 Drawing Sheets

INTER-METAL DIELECTRIC LAYER

BACKGROUND OF THE INVENTION

1. Field of the Invention

The present invention is related to a method for manufacturing intermetal dielectric (IMD) layers by forming fluorine silicate glass by high density plasma deposition using radio frequency power of low bias voltage. High Density Plasma—Chemical Vapor Deposition (HDP-CVD) is mainly applied to dense thin films formed under low temperatures, wherein, the basic material, silicon, is placed in the plasma in vapor state to form the thin films. Such thin films are all better than those formed by "Plasma Enhanced Chemical Vapor Deposition (PECVD)" no matter in the Gap-Fill capability or the effect of density; thereby, it is widely used for inter-metal dielectric (IMD) layers between metal parts, dielectric semiconductors between every two of multiple internal connecting layers and in forming special metallic layers of tungsten, aluminum or copper.

2. Description of the Prior Art

The method of High Density Plasma—Chemical Vapor Deposition (HDP-CVD) is established by extending of a series of processes, such as Deposition-Etching-Deposition (Dep-Etch-Dep), the process includes:

a deposition process, from forming of a film to appearing of prongs, in the process, a dielectric layer is deposited in the gaps between parts of metal conductors, when the dielectric layer is deposited on the lateral walls in the gaps between the metal parts before forming a crevice, the deposition process is terminated;

an etching and sputtering process to form a corner plane, in the process, wafers are moved to an etching chamber, by a process of sputtering with argon ions, the prongs formed in the foregoing step are removed to form a corner plane;

another deposition process, wherein, the wafer with the plane formed by removing the prongs is once more processed by deposition to have a dielectric layer in the gaps;

by the repeated Dep-Etch-Dep process, the gaps in the metal parts are fully filled with dielectric.

The number of times in repeating the process depends on the widths of the gaps and the aspect ratio of the pattern on the base plate, the conventional High Density Plasma—Chemical Vapor Deposition (HDP-CVD) chamber has two combined functions, i.e., deposition of oxide and etching of argon ions that can be simultaneously proceeded in the same chamber. The deposition forming prongs and the etching and sputtering process are two different kinds of phenomenon of physics and chemistry. However, the two different kinds of phenomenon can be intercrossingly used in the whole method, To fill the dielectric in the gaps between metal parts, control of the amount of bias voltage of the power of radio frequency in the High Density Plasma—Chemical Vapor Deposition (HDP-CVD) process is required.

In the conventional technique, the full flow in forming a dielectric layer between metal parts, such as is depicted in FIG. 1A and 1D, includes:

providing a base 100 which is processed by lithography and etching to form a metallic layer 101 with a pattern and a plurality of gaps 102 each being disposed between every two metal parts;

forming on the metallic pattern layer 101 a dielectric layer 103 which is formed from fluorine silicate glass by high density plasma deposition and fills the metallic pattern layer 101 and the gap 102 between every two metal parts;

providing a chemical-mechanic polishing to make the dielectric layer 103 plane;

forming a covering oxide layer 105 by plasma enhancing deposition.

Wherein, it needs more time to render the dielectric layer 103 in the gap 102 between every two metal parts and formed from fluorine silicate glass by high density plasma deposition to get the desired thickness, because elevated rate of deposition can make the gap 102 between every two metal parts tunable to be completely filled, and this will influence characteristic of the circuit.

Thereby, another conventional technique provides an embedment process in the dielectric layer forming technique between every two metal parts to solve the aforesaid defects such as are shown in FIGS. 2A to 2E. The embedment process uses a deposition method with faster rate of deposition to form a thicker dielectric layer formed from fluorine silicate glass by high density plasma deposition after filling the gap between every two metal parts, the process includes:

providing a base 200 which is processed by lithography and etching to form a metallic layer with a pattern 201 and a plurality of gaps 202 each being disposed between every two metal parts;

forming on the metallic pattern layer 201 a first dielectric layer 203 which is formed from fluorine silicate glass by high density plasma deposition and fills onto the metallic pattern layer 201 and the gap 202 between every two metal parts;

forming on the first dielectric layer 203 a second dielectric layer 204 which has a kind of oxide deposited as a sacrificial oxide;

providing a chemical-mechanic polishing to make the second dielectric layer 204 plane;

forming a covering oxide layer 205 by plasma enhancing deposition.

Unfortunately, such an embedment process has inevitably the following defects as shown in FIG. 4:

1. The embedment process has complicated steps.
2. It is subjected to forming slits.
3. The multiple layers of interfaces are subjected to attachment of water vapor.

SUMMARY OF THE INVENTION

In view of the above limitations and inevitable defects resided in the conventional arts, the present invention discloses merging of the two steps in the embedment process (which requires two machines)—"forming on the metallic pattern layer 201 a first dielectric layer 203" and "forming oil the first dielectric layer 203 a second dielectric layer 204" —wherein, the two steps arc completed in only one machine. The steps executed on the machine include filling in a gap with fluorine silicate glass by high density plasma deposition with slower rate of deposition and radio frequency power of high bias voltage, and then using fluorine silicate glass deposited with fast rate of deposition and radio frequency power of no or low bias voltage as a sacrificial layer, and being made plane by a chemical-mechanic polishing CMP. In this way, in the whole flow of manufacturing, it is no necessity to increase burden on operators, and using and allocation of machines can be reduced, thereby, the present invention has the advantages of elevating production rate, reducing deposition steps, avoiding creating of slits and reducing generation of interfaces.

The present invention has an object to provide a method for manufacturing dielectric layers between metal parts by forming fluorine silicate glass by high density plasma deposition using radio frequency power of low bias voltage. Wherein, the two steps in the conventional embedment process are completed in only one machine. The steps include filling in a gap with fluorine silicate glass by high density plasma deposition with slower rate of deposition and radio frequency power of high bias voltage, and then using a fluorine silicate glass deposited with fast rate of deposition and radio frequency power of no or low bias voltage as a sacrificial layer, and being made plane by a chemical-mechanic polishing CUT. The process includes:

provides a base which is processed by lithography and etching to form a metallic layer with a pattern and a plurality of gaps each being disposed between every two metal forming on the metallic pattern layer a first dielectric layer and the gap between every two metal parts, then forming on the first dielectric layer a second dielectric layer; the first dielectric layer is formed from fluorine silicate glass by high density plasma deposition and fills the metallic pattern layer and the gap between every two metal parts; the second dielectric layer is formed on the first dielectric layer by deposition of fluorine silicate glass by high density plasma deposition with low bias voltage;

providing a chemical-mechanic polishing to make the second dielectric layer plane;

forming a covering oxide layer by plasma enhancing deposition.

DETAILED DESCRIPTION OF THE PREFERRED EMBODIMENT

Figure 1A:
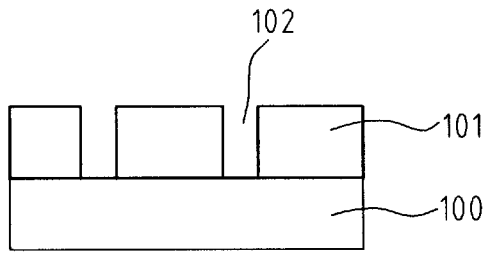
FIGS. 1A to 1D are schematic views showing the full flow of the method forming a metallic dielectric layer in a conventional technique.
Figure 1B:
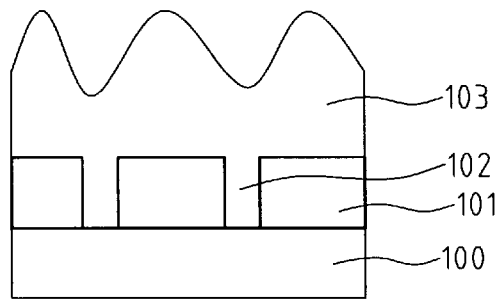
Figure 1C:
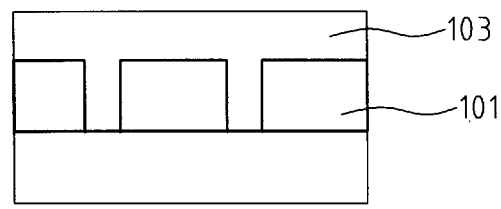
Figure 1D:
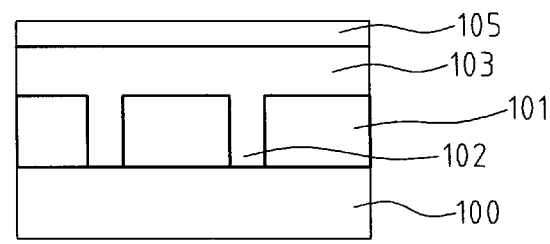
Figure 2A:
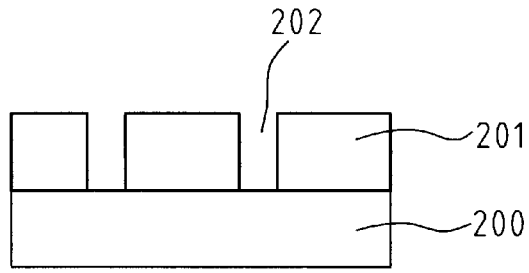
FIGS. 2A to 2E are schematic views showing the full flow of the embedment process forming a metallic dielectric layer in another conventional technique.
Figure 2B:
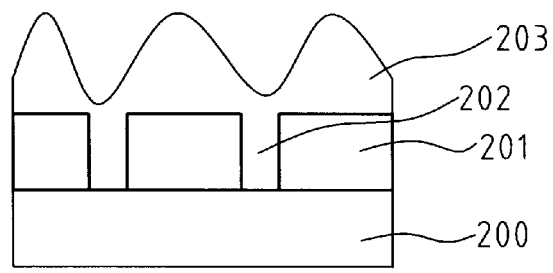
Figure 2C:
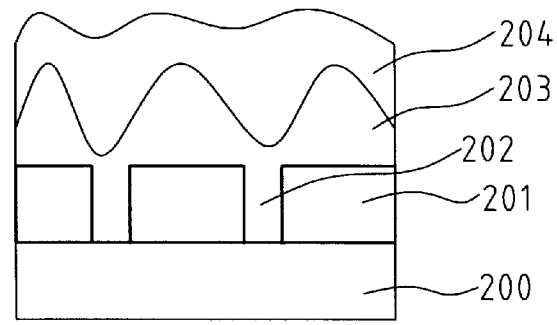
Figure 2D:
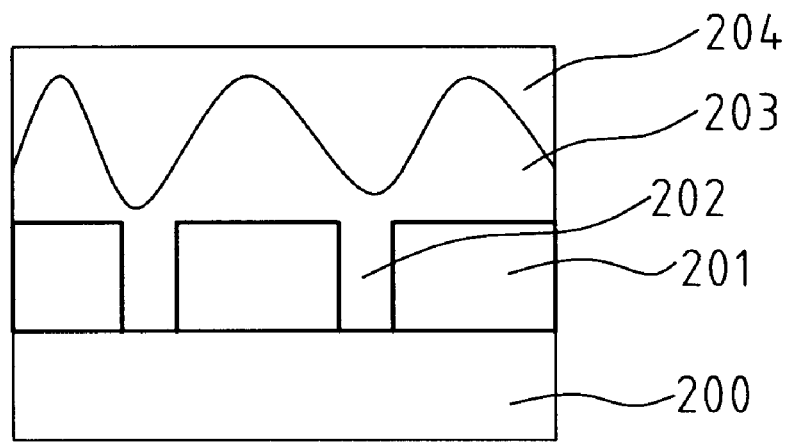
Figure 2E:
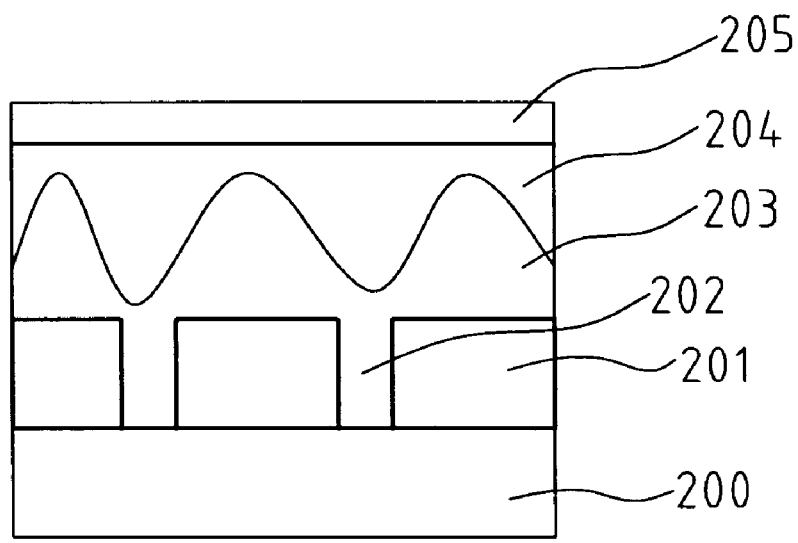

Referring to FIGS. 4A to 4D which are schematic views showing the full flow of the process forming a metallic dielectric layer in the present invention by forming fluorine silicate glass by high density plasma deposition using radio frequency power of low bias voltage.

In the first place, as shown in FIGS. 4A to 4D, the process of forming a metallic dielectric layer by forming fluorine silicate glass by high density plasma deposition using radio frequency power of low bias voltage in the present invention includes:

providing a base 400 which is processed by lithography and etching to form a metallic layer 401 with a pattern and a plurality of gaps 402 each being disposed between every two metal parts;

forming on the metallic pattern layer 401 and the gap 402 between every two metal parts a first dielectric layer 403, then forming on the first dielectric layer 403 a second dielectric layer 404;

making the second dielectric layer 404 plane;

forming a covering oxide layer 405.

Figure 4A:
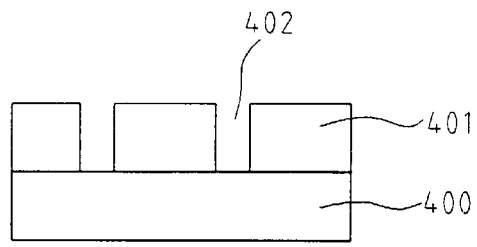
FIGS. 4A to 4D are schematic views showing the full flow of the process forming a metallic dielectric layer in the present invention.

Wherein, as shown in FIG. 4A, in the step of forming a metallic layer 401 with a pattern, the metallic pattern layer 401 is formed on the base 400 by forming firstly a film of metal or metallic alloy material by CVD, evaporation or sputtering, then the desired metallic pattern layer 401 and the gap 402 between every two metal parts are formed by lithography and etching.

Figure 4B:
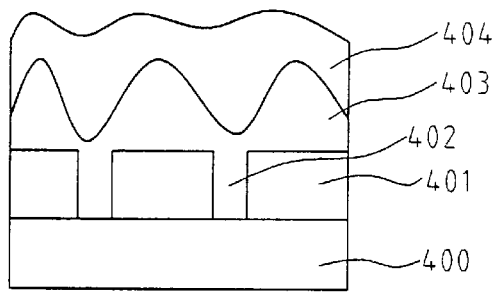

As shown in FIG. 4B, in the step of forming on the metallic pattern layer 401 and the gap 402 between every two metal parts the first dielectric layer 403, the first dielectric layer 403 is formed on the metallic pattern layer 401 and the gap 402 between every two metal parts from fluorine silicate glass by high density plasma deposition. Wherein, the fluorine silicate glass formed by high density plasma deposition uses radio frequency power deposition. In the process forming the fluorine silicate glass by high density plasma deposition, by changing of the bias in the radio frequency power, rate of deposition of the fluorine silicate glass will be changed. And certainly, it is not the fact to say the higher rate of deposition the better. When the gap 402 between every two metal parts are smaller, the rate of deposition shall be lowered, in order to avoid the case that the first dielectric layer 403 does not completely fill the gaps 402 and in turn the characteristic of the circuit is influenced.

Figure 5:
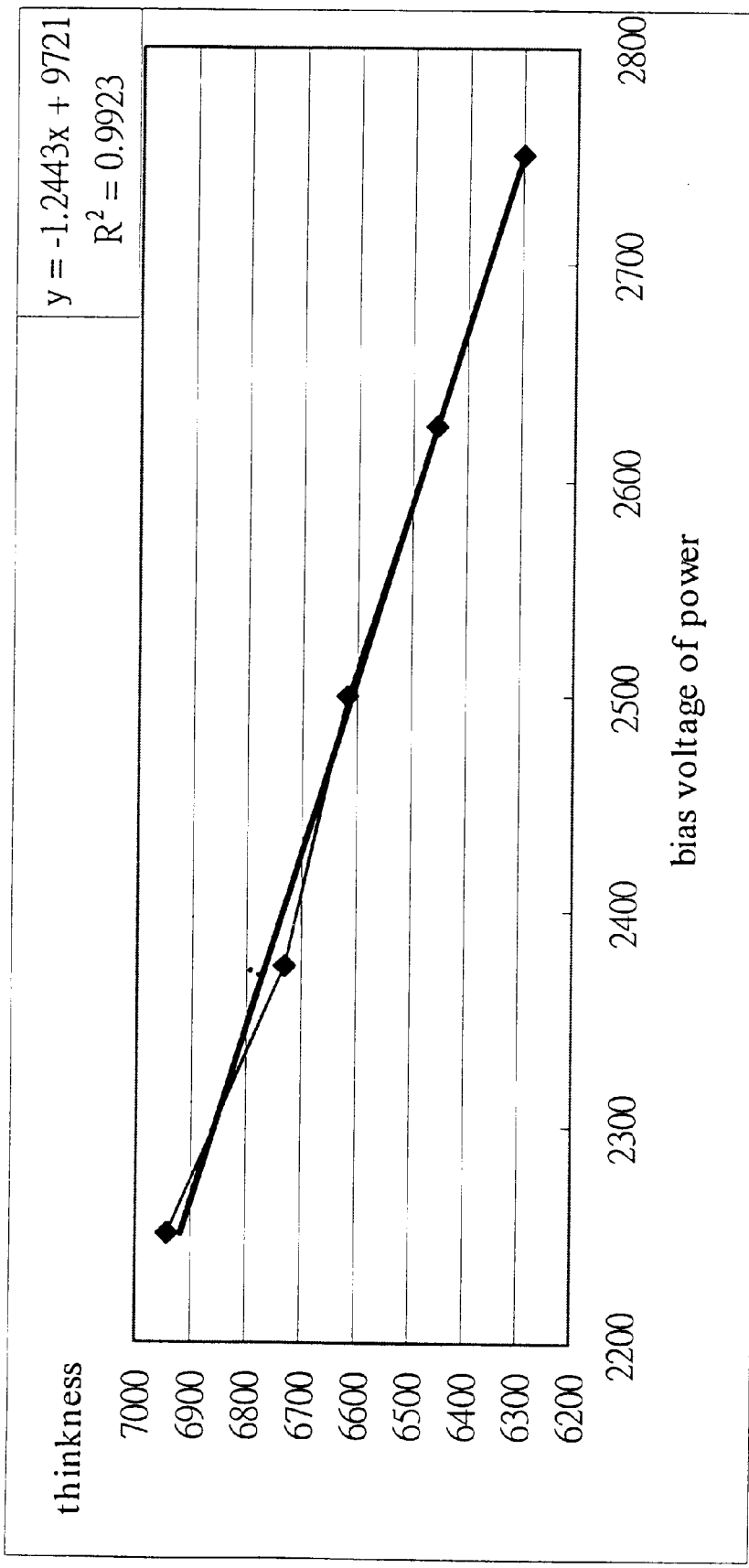
FIG. 5 is a chart showing the relationship between the amount of bias voltage of the power of radio frequency and the thickness of fluorine silicate glass in forming the fluorine silicate glass by high density plasma deposition in the present invention.

Also as shown in FIG. 4B, in the step of forming on the first dielectric layer 403 the second dielectric layer 404, the second dielectric layer 404 is deposited on the first dielectric layer 403 by deposition of fluorine silicate glass by high density plasma deposition with low bias voltage. Wherein, the gap 404a on the second dielectric layer 404 is larger as well as flatter than that of the gap 402 between every two metal parts, and the second dielectric layer 404 is used as a sacrificial layer which will be made plane with a CMP; thereby, the power of bias voltage will be lowered, and even lowered to zero, in order to get a highest rate of deposition. It is shown in FIG. 5 that the rate of deposition will be higher when the bias voltage in the frequency power is lower.

Figure 4C:
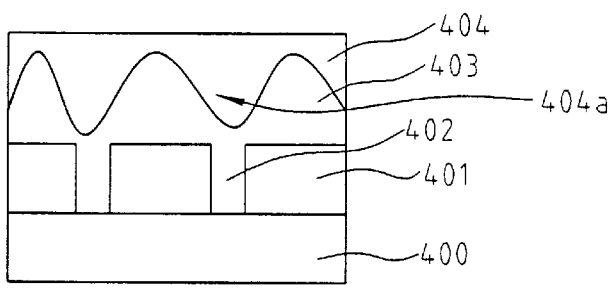
Figure 4D:
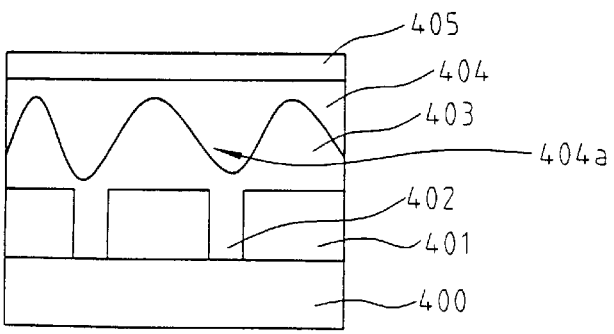

As shown in FIG. 4C, in the step of making the second dielectric layer 404 plane, it is dealt with a chemical-mechanic polishing CMP. As shown in FIG. 4D, in the step of forming a covering oxide layer 405, the oxide layer 405 is formed by plasma enhancing deposition as a plasma enhanced oxide cap (PE-Oxide Cap), the step can reduce defects on a wafer.

Figure 3:
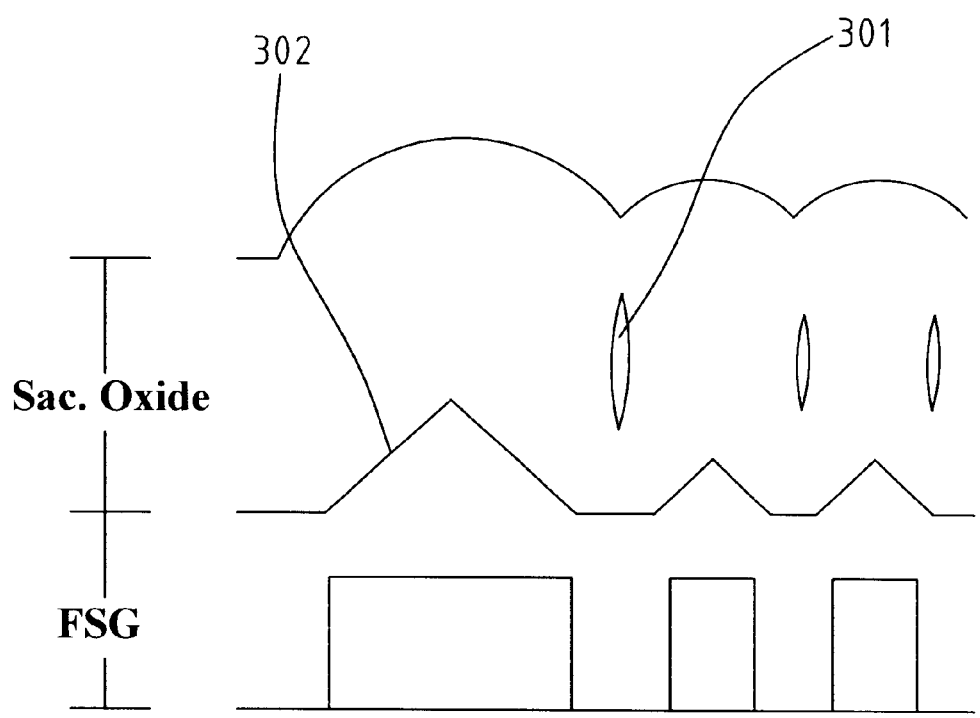
FIG. 3 is a schematic view showing the metallic dielectric layer formed by the embedment process of the aforesaid another conventional technique.

From the method of the present invention disclosed above, it can be known that, the present invention takes advantage of adjusting the bias in the radio frequency power in the process of forming fluorine silicate glass by high density plasma deposition to control the rate of deposition of forming fluorine. On one hand, this can completely make the dielectric layers fill the gap between every two metal parts; on the other hand, this can increase the rate of deposition of the sacrificial oxide layer. Thereby, the present invention can render the two steps which are supposed to be executed in different machines completed in only one machine. It only needs to adjust the bias by a recipe of program to solve the problems of being subjected to forming of slits 301 and that multiple layers of interfaces 302 are subjected to attachment of water vapor (referring to FIG. 3).

Therefore, the present invention can surely get the expected object and effect by the method for manufacturing dielectric layers between metal parts by forming fluorine silicate glass by high density plasma deposition using radio frequency power of low bias voltage. It is novel and advanced as well as industrially valuable.

The above statement and drawings depicted are only for illustrating preferred embodiments of the present invention, and not for giving any limitation to the scope of the present invention. It will be apparent to those skilled in this art that all equivalent modifications and changes without departing from the spirit and principle of the present invention shall fall within the scope of the appended claims and are intended to form part of this invention.

What is claimed is:

1. A semiconductor structure comprising:
   a base which is processed by lithography and etching to form a metallic pattern layer, and a plurality of gaps each being disposed between every two metal parts;
   a first dielectric layer on said metallic pattern layer and said plurality of gaps, said first dielectric layer being formed by high density plasma deposition and filling said plurality of gaps;
   a second dielectric layer on said first dielectric layer, said second dielectric layer being formed by high density plasma deposition with low bias voltage; and
   a covering oxide layer formed by plasma enhancing deposition;
   wherein said first and second dielectric layers are formed by a same material.

2. A semiconductor structure as in claim 1, wherein said first and second dielectric layers are formed from fluorine silicate glass (FSG), phosphosilicate glass (PSG), or boron phosphosilicate glass (BPSG).

3. A semiconductor structure as in claim 1, wherein said metallic pattern layer comprises tungsten, aluminum, copper or conductive metal or alloys.

4. A semiconductor structure as in claim 1, wherein said first dielectric layer is formed by high density plasma deposition using radio frequency power with bias voltage, said bias voltage is adapted for adjusting in pursuance of said metallic pattern layer and said gaps formed.

5. A semiconductor structure as in claim 1, wherein said first dielectric layer is formed from fluorine silicate glass by high density plasma deposition using biased radio frequency power of approximately 2500W.

6. A semiconductor structure as in claim 1, wherein said second dielectric layer is formed by high density plasma deposition using radio frequency power with bias voltage, said bias voltage is adapted for adjusting in pursuance of rate of deposition desired.

7. A semiconductor structure as in claim 1, wherein said second dielectric layer is formed from fluorine silicate glass by high density plasma deposition using low biased radio frequency power of at least 0W to 50% of biased radio frequency power used for deposition of said first dielectric layer.

* * * * *